US00RE44402E

(19) United States
(12) Reissued Patent
Meier et al.

(10) Patent Number: US RE44,402 E
(45) Date of Reissued Patent: Jul. 30, 2013

(54) SYSTEM AND METHOD FOR STORING A SEQUENTIAL DATA STREAM

(75) Inventors: Karl Meier, Portland, OR (US); Nathan Dohm, Natick, MA (US)

(73) Assignee: Jinsalas Solutions, LLC, Dover, DE (US)

(21) Appl. No.: 12/943,839

(22) Filed: Nov. 10, 2010 (Under 37 CFR 1.47)

Related U.S. Patent Documents

Reissue of:
(64) Patent No.: 7,451,282
Issued: Nov. 11, 2008
Appl. No.: 11/076,464
Filed: Mar. 9, 2005

(51) Int. Cl.
*G06F 12/00* (2006.01)

(52) U.S. Cl.
USPC ..... 711/158; 711/151; 711/5; 711/6; 711/E12.002

(58) Field of Classification Search
USPC ..... 711/158, 169, E12.001, E12.002; 710/5, 710/6, 39, 40, 41, 58, 116, 123; 718/100, 718/102, 103; 370/392, 393, 394; 717/120
See application file for complete search history.

(56) References Cited

U.S. PATENT DOCUMENTS

| | | | | |
|---|---|---|---|---|
| 5,410,546 | A | 4/1995 | Boyer et al. | |
| 6,510,474 | B1 * | 1/2003 | Stracovsky et al. | 711/158 |
| 6,526,484 | B1 | 2/2003 | Stacovsky et al. | |
| 7,149,857 | B2 * | 12/2006 | Jeddeloh | 711/158 |
| 7,240,347 | B1 | 7/2007 | Lim et al. | |
| 7,243,184 | B1 * | 7/2007 | Ferguson et al. | 711/100 |
| 2003/0212985 | A1 * | 11/2003 | Chan et al. | 717/120 |

* cited by examiner

*Primary Examiner* — Pierre-Michel Bataille

(57) ABSTRACT

The present invention provides an improved apparatus and method for the receipt of high-speed sequential data streams. It utilizes the concept of banked memories to reduce the required speed and size of the input buffers used to receive the data streams. This allows the device to employ large, relatively slow memory elements, thereby permitting large amounts of sequential data to be stored by the receiving device. Using control information that was written as the data was being stored in the memory banks, a reordering element is later able to retrieve the data elements from the plurality of memory banks, in an order that is different from that in which the stream was received, and to reassemble the data stream into the original sequence.

25 Claims, 4 Drawing Sheets

| | | | | | | | | | |
|---|---|---|---|---|---|---|---|---|---|
| 100 | Data Stream | Input 0 | Input 1 | Input 2 | Input 3 | Input 4 | Input 5 | Input 6 | Input 7 |
| 110 | Bank 0 | | Input 0 | | Output C | | Input 4 | | Output G |
| 120 | Bank 1 | | | Input 1 | | Output D | | Input 5 | | Output H |
| 130 | Bank 2 | | Output A | | Input 2 | | Output E | | Input 6 |
| 140 | Bank 3 | | | Output B | | Input 3 | | Output F | | Input 7 |

| | | | | | | | | | |
|---|---|---|---|---|---|---|---|---|---|
| 100 | Data Stream | --- | --- | --- | Input 0 | Input 1 | Input 2 | Input 3 | Input 4 |
| 110 | Bank 0 | | --- | | Output C | | Input 1 | | Output G |
| 120 | Bank 1 | | | --- | | Output D | | Input 2 | | Output H |
| 130 | Bank 2 | | Output A | | --- | | Output E | | Input 3 | |
| 140 | Bank 3 | | | Output B | | Input 0 | | Output F | | Input 4 |

| Data Stream | Input 0 | Input 1 | Input 2 | Input 3 | Input 4 | Input 5 | Input 6 | Input 7 |
|---|---|---|---|---|---|---|---|---|
| Bank 0 | | Input 0 | Output B | Input 2 | Output D | Input 4 | Output F | Input 6 | Output H |
| Bank 1 | | Output A | Input 1 | Output C | Input 3 | Output E | Input 5 | Output G | Input 7 |

| Data Stream | Input 0 | Input 1 | Input 2 | Input 3 | Input 4 | Input 5 | Input 6 | Input 7 |
|---|---|---|---|---|---|---|---|---|
| Bank 0 | In 0 | Out B | Out C | In 2 | Out F | Out G | In 4 | Out J | Out K | In 6 | Out L |
| Bank 1 | Out A | In 1 | Out D | Out E | In 3 | Out H | Out I | In 5 | Out L | Out M | In 7 |

SYSTEM AND METHOD FOR STORING A SEQUENTIAL DATA STREAM

Matter enclosed in heavy brackets [ ] appears in the original patent but forms no part of this reissue specification; matter printed in italics indicates the additions made by reissue.

BACKGROUND OF THE INVENTION

In computer systems, there is often a need to receive and store an incoming data stream, with the purpose of using or transmitting that data at a later time. In the case of data streams containing information utilizing a specific format, the order in which the data is received is relevant to its content and context. Therefore, in these cases, it is essential not only to capture the individual data elements in the stream, but it is also essential that the order in which the data stream was received is preserved.

Therefore, many implementations utilize FIFOs or buffers to capture the data stream as it is received, typically using sequential addresses in the storage elements to store each subsequent data element. For example, in the case of a computer network, an incoming packet is received by a network device, such as a switch, a router, or an end node. This packet usually conforms to a specific protocol, such as Ethernet, PCI, FDDI, ATM, or others, which define the format, and therefore the context of each data element. Most typically, these network devices utilize storage elements, such as random access memories (RAMs) to store the data stream as it is received. Memory elements have a number of locations into which data can be written or from which data can be read, known as addresses. In the case of data streams, these memories typically store consecutive data elements from the incoming data stream in consecutive memory locations. By doing so, the data elements are retained, as is the sequence of the data. Using this method, a particular data element within a data stream can be identified by the address in memory where the first data element is stored (known as the starting address), and the location of the desired data element within the stream. Thus, if the incoming stream was stored in memory beginning at starting location M, and the data element of interest was the $N^{th}$ received in the data stream, that data element will necessarily be stored in location M+N−1.

The use of a single memory element to receive and store incoming data streams is well known, and provides a simple method of preserving the original sequence of the incoming data stream. However, it is not without its drawbacks. In many cases, such as that of computer networks, the speeds at which data streams can be transmitted constantly increases, thus requiring a corresponding increase in the speed of the memory element receiving the data stream. In fact, in most applications, the memory element operates at speeds greater than the incoming data stream, preferably greater than twice the incoming data rate. By having twice the speed of the incoming data, the memory element is able to transmit a previously stored data stream while simultaneously receiving an incoming data stream. In this way, it is guaranteed that the memory can empty itself of old data streams at least as quickly as it is receiving new data streams. Thus, a memory element operating at a rate of at least twice the speed of the incoming data should never fill under ideal conditions.

However, as the rates at which data packets can be sent increases, it becomes more difficult to have memory elements capable of operating at more than twice that speed. Such memories, while available, are typically expensive or consume significant amounts of silicon within an integrated circuit. One alternative, known as dual port memories, allow simultaneous access to two addresses. However, these memories typically require significant silicon space as well.

In addition to the speed requirements associated with these memories, in many applications, such as computer networks, there is also a concurrent need for large amounts of storage. To optimize network traffic, it is very advantageous for a receiving device to be able to store many incoming messages quickly. The most common way of achieving this goal is to incorporate large amounts of memory into the receiving devices, thereby enabling them to receive significant amounts of data. However, the combination of large amounts of memory and high speed is difficult to achieve. Therefore, there is typically a compromise between performance and device size and cost, to balance these conflicting goals.

In view of these tradeoffs, a system and method for receiving large amounts of high speed sequential data, and retaining the data elements, and their order of arrival is needed.

SUMMARY OF THE INVENTION

The problems with the prior art have been overcome with the present invention, which provides an improved system and method for the storing of sequential data streams.

One technique that can be used to reduce the memory bandwidth is to utilize a number of memory elements to receive the incoming data stream. Using a predetermined order, portions of the incoming data stream can be stored in each of a number of memory elements. For example, assume that four memory elements are utilized. The first data element of the incoming stream would be written to the first memory element; the second data element to the second memory, until each memory element had received one data element. At this point, the sequence would repeat, such that the fifth data element is stored in the same memory element as the first data element. Since the incoming data stream is being stored in four separate memory elements, the speed required of those memories is reduced by a factor of four. Similarly, since there are four separate memory elements, the size of each can be reduced by a factor of four. This presents a much more feasible solution than a single large, very high speed memory.

This technique, also known as memory banking, is well known and is used elsewhere in electronics. However, its usage is typically confined to those applications where the source of the data which is being stored in the banked memory is deterministic or is controlled. As an example, the memory system of a personal computer may be banked. In this case, all of the data sources, including the input devices such as CD and DVD readers, are controlled by the central processing unit. This CPU typically assigns the starting address to which the data will be written. Thus, it can be guaranteed that streams of data will always be stored starting at a specific location within a specific bank in memory. Similarly, the stored data can also be read out of banked memory in a specific order. Similar attributes exist in most banked memory architectures.

The banking technique has typically been less desirable in applications where the data sources are less predictable. For example, in a network switch, data begins arriving at the switch at indeterminate times. This makes it difficult to align the incoming data to insure that the first element is written into the first bank. Therefore, it is not possible to insure that when the data stream is read from the memory elements, that it is read in the correct sequence, since the first element may not be in the first bank.

The present invention utilizes the concept of banked memories to reduce the required speed and size of the input buffers. This allows the devices to employ large, relatively slow memory elements, thereby permitting large amounts of sequential data to be stored by the receiving device. Because of the nature of the banked memory architecture, the first element of the data stream may not always be stored in the first memory element. However, the receiving device then uses control information, which it previously generated and stored in conjunction with each element of the sequential data to properly reconstruct the data stream into the correct sequence.

Briefly, the banked memories are set up such that each receives a unique time slice during which it writes the data element which is currently being received (if any). Each bank also has at least one unique time slice during which its contents may be read by other logic within the device. As a sequential data element arrives, it is written into whichever memory bank is enabled to write data during that particular time slice. The subsequent data elements are then stored in the memory banks according to the order in which the individual banks are enabled for storing data.

At a later time, logic within the device begins to read the data from the memory banks. Since there is no predetermined bank wherein the storage of all incoming data streams is guaranteed to start, the logic is unable to guarantee that it always reads the first data element of the sequential stream first.

Using control information that was written as the data was being stored in the memory banks, the logic is able to reassemble the data stream into the original sequence used when the data was transmitted to the device.

DETAILED DESCRIPTION OF THE INVENTION

Figures 1, 2A:
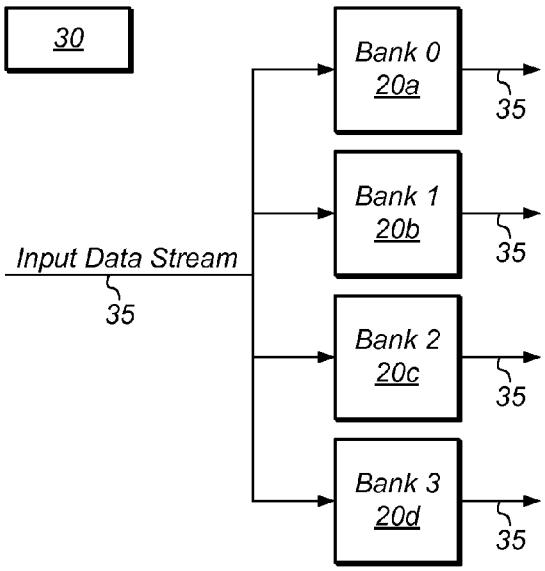
FIG. 1 illustrates a first embodiment of a banked memory architecture used to store incoming sequential data streams in accordance with the present invention.
FIG. 2a illustrates a first representative timing diagram implemented in conjunction with the architecture of FIG. 1.
Figures 2B, 3, 4A:
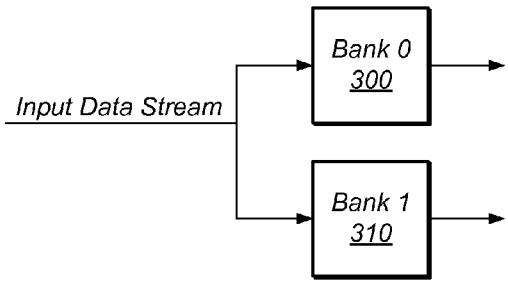
FIG. 2b illustrates a second representative timing diagram implemented in conjunction with the architecture of FIG. 1.
FIG. 3 illustrates a second embodiment of the banked architecture used to store incoming sequential data streams in accordance with the present invention.
FIG. 4a illustrates a first representative timing diagram implemented in conjunction with the architecture of FIG. 3.

FIG. 1 illustrates a first embodiment of the banked memory elements used within the receiving device. Input Data Stream 10 is the input to each of the memory elements 20. In FIG. 1, a total of four memory elements are shown. However, the present invention is not limited to specifically four banks; the invention simply requires that there be more than one memory bank. During specific time intervals, a single one of the memory elements is enabled to store a data element from the data input stream 10. Each of the memory elements is also enabled during a different time interval to output data which it has previously stored. FIG. 2a illustrates a representative timing diagram that best illustrates the operation of a typical banked memory configuration. Row 100 displays the input data stream. In FIG. 2a, a total of 8 data elements are shown. However, there is no minimum or maximum number of data elements that may be contained in a given input data stream. In this particular diagram, the first data element in the data stream, Input 0, is available and stored when Bank 0 (shown in Row 110) is enabled. During the next clock cycle, Bank 0 (Row 110) is disabled, and Bank 1 (Row 120) is enabled to store the next data element, Input 1. The process continues until each of the memory elements has stored one data element. At this point, the sequence repeats, with the fifth data element, Input 4, being stored in Bank 0 (Row 110). Although this example shows that the first data element is stored in the first bank, this is not a requirement, nor is it possible to guarantee this behavior. The operation of the banks is deterministic, as can be seen in FIG. 2. However, the input data stream typically arrives from another source and is therefore not aligned with the internal timing of the receiving device. Therefore, as shown in FIG. 2b, it is possible that the first data element of the Input Data Stream arrives when Bank 3 (Row 140) is enabled. In this scenario, Bank 3 stores the first data element, Bank 0 stores the second data element, Bank 1 stores the third data element, Bank 2 stores the fourth data element, and the pattern repeats for the length of the input data stream.

With any banked memory architecture, one of the biggest advantages is that the speed of the memory elements can be reduced. In FIG. 2a, each bank need only store every fourth data element, therefore lowering the required speed. To generalize, the bandwidth needed for each memory element to store the input data stream can be given by L/B, where L is the line rate, or the rate at which input data elements arrive, and B is the number of memory banks.

In FIGS. 2a and 2b, the memory elements are configured such that they are enabled to output a previously stored data element every fourth cycle. Thus, when Bank 0 (Row 110) is storing Input 0, Bank 2 (Row 130) is outputting a previously stored element. This element could be from the current input data stream, or from a data stream that was received at an earlier time. In this scenario, the order in which the memory banks output previously stored data elements tracks the order in which the banks store data elements. The bandwidth needed for each memory element to output a data element can also be given by L/B, when the rate at which the elements are output matches the rate at which they are stored, as is the case in FIG. 2.

In the embodiments illustrated in FIGS. 2a and 2b, the total bandwidth of each memory bank is 2*L/B or L/2. Therefore, each memory needs to operate at only half the speed of the incoming data stream.

Figures 4B, 5:
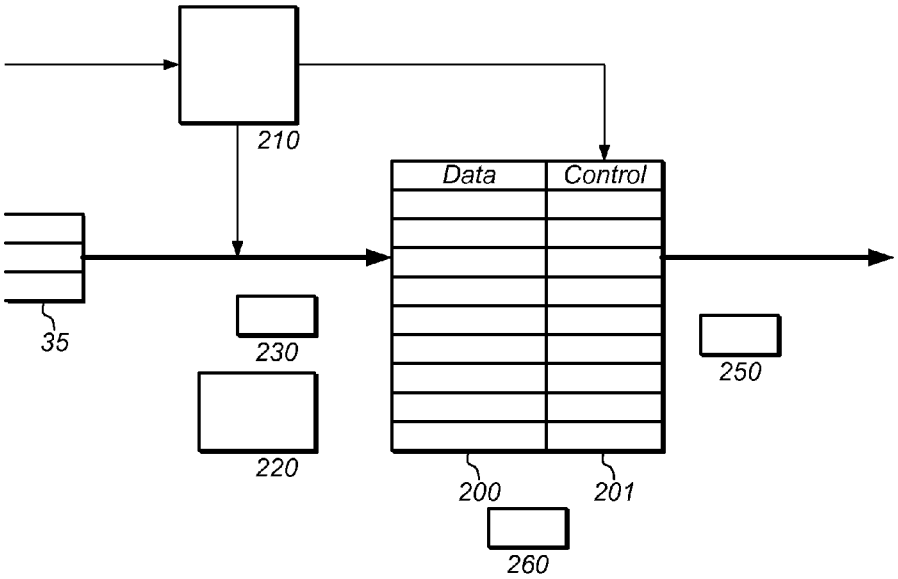
FIG. 4b illustrates a second representative timing diagram implemented in conjunction with the architecture of FIG. 3.
FIG. 5 illustrates a representative embodiment of the re-ordering element of the present invention.

FIG. 3 shows an alternate embodiment of the memory banking architecture. In this embodiment, the input data stream is directed to two memory elements, Bank 0 300 and Bank 1 310. FIG. 4a shows a first representative timing diagram that can be used in conjunction with the configuration of FIG. 3. During each clock cycle, one of the banks stores an incoming data element, while the other bank outputs a previously stored element. Using this configuration, the bandwidth needed by each memory element to receive input data elements is given by L/B, or L/2. Similarly, the bandwidth needed to output previously stored elements is L/2. Thus, each memory element has a total bandwidth of L, which is half of the bandwidth which is needed if only a single memory element is employed. FIG. 4b shows a second representative timing diagram that can be used in conjunction with FIG. 3. In this scenario, the memory elements are configured such that there is twice as much bandwidth available to output previously stored elements as there is to store new input data elements. This configuration is useful in a variety of scenarios. For example, if there are two destinations for the stored data, each destination is able to access that data at the line rate. A scenario as is illustrated in FIG. 4b is also useful to allow the receiving device to quickly be able to retrieve stored data elements, thus minimizing the chances that the memory elements will become full.

Returning to FIG. 4b, the memory elements operate using a clock rate which is 1.5 times that of the incoming data stream. This enables the memories to each devote a third of their bandwidth to the incoming data stream and two thirds of their bandwidth to the output data stream. FIG. 4b shows that Bank 0 stores a data element every third clock cycle, while the other two cycles are used to output data. Bank 1 has the same pattern, simply skewed in time by one clock cycle. Thus, in the time required to store two new data elements, such as Input 1 and Input 2, the memory elements are able to output four previously stored elements, Outputs B, C, D and E.

Returning to FIG. 1, each of the memory elements 20 is in communication with the input data stream 10, as previously described. In addition to the actual data elements, control information associated with the relative position of the particular data element in the current data stream is also transmitted to the reordering storage element. This control information can be generated using a number of techniques. In one embodiment, as a new input data stream arrives, an entry is created in a separate memory element 30. This entry contains the starting address of the data stream within the banks, as well as the bank number at which the first data element of the stream was stored. In addition, either the last address of the data stream, or the number of data elements in the data stream is also stored. It is well known to those skilled in the art, that based on the starting address and the number of data elements in a data stream, status indicators can be generated for each data element which indicate their relative position within the data stream. More specifically, it is possible to identify the first data element, and the last data element, while the remainder of the data elements is collectively identified as being in the middle. In the preferred embodiment, a flag is stored with the first data element as it is written into the memory element 20, indicating that it is the first data element. Alternatively, a count of the data elements modulo N, where N is the number of banks can be employed. As the data is read out of the memory elements 20, this flag is used to determine the OFFSET value (described in more detail later) that is passed to the ordering logic. A similar flag is used to indicate the end of the packet. Alternatively, the number of data elements contained in the packet can be stored, either with the first data element, or in a separate storage element 30. As the data elements are presented to the reordering element, this number is decremented, and a signal indicating the end of the packet is generated when the count reaches zero.

FIG. 5 illustrates an embodiment of the high speed reordering storage element of the current invention. The data paths 35 from the banked memory elements (as shown in FIG. 1 and FIG. 3) are all in communication with the reordering storage element 200, which is preferably a FIFO or register file. Data paths 35 transmit the previously stored data elements. The associated control information described above is used by the status logic 210 to generate revised control information which is stored in conjunction with the data elements in the storage element 201. In the preferred embodiment, the following control information is passed to the status logic 210:

| Status Encodings transmitted to Status Logic (incoming control information) | |
|---|---|
| SOP_EOP | start of packet and end of packet (only valid in a single word packet) |
| SOP | start of packet |
| MOP | middle of packet - asserted for all data elements that are not SOP or EOP |
| EOP | end of packet |
| IDLE | no data this cycle |
| EOPK | end of packet that was cut-through and killed. This encoding is only valid in cut-through implementations. |

SOP indicates that the current data element is the first data element in a new data stream. In the preferred embodiment, this indicator is transmitted when the first data element within a data stream is being presented. In one embodiment, the address of the data element within the banked memory elements is compared to the stored starting address. The first element in which a match is found is deemed to be the SOP. It is important to note that there are multiple banks, and each of these banks utilizes the same addresses. Therefore, it is possible that the SOP indicator is applied to a data element that is from the right address, but the wrong bank. Thus, the SOP indicator actually signifies that this is the first data element of the data stream that the reordering element has received, rather than signifying that this is actually the first data element of the data stream.

Conversely, EOP indicates that the current data element is the last data element in a data stream. In the preferred embodiment, this indicator is transmitted when the total number of data elements transmitted matches the value contained in the entry associated with this data stream. As was the case above, the EOP indicator actually signifies that this is the last data element that the reordering element will receive, rather than signifying that it is truly the last data element of the input data stream.

IDLE indicates that no data elements are currently being transferred. These three indicators, SOP, EOP and IDLE, are the minimum set of control information necessary to implement the present invention. The other indicators are used to provide additional functionality.

MOP indicates that the current data element is neither the first nor the last in the current data stream. While this can be inferred through monitoring of SOP, EOP, and IDLE, a separate indicator can be used to simplify the logic associated with the Status Logic 210.

SOP_EOP is a special indicator that is only used with data streams that are exactly one data element in length. In those cases, the first data element and the last data element are one in the same, and thus a separate indicator is created. For embodiments in which single data element data streams are not permitted, this indicator can be eliminated.

Finally, EOPK indicates that the current data element is the last element of the data stream, in which the data stream has not been properly received. In addition to indicating that this is the last data element of the stream, this indicator signifies that the data elements from this data stream that preceded it should all be discarded. This indicator is only necessary in implementations in which the banked memory elements begin outputting a data stream before that entire data stream has been received.

Finally, an indicator, known as OFFSET, is also created. This indicator signifies the order in which the data will be presented to the reordering storage element. In the preferred embodiment, an OFFSET of 0 indicates that the data is in the proper order, i.e. data element 0, data element 1, etc. An OFFSET of 1 indicates the first data element will be transmitted after each of the other banks has transmitted one element. In the case of four banks, this sequence would be data element 1, data element 2, data element 3, data element 0, data element 5, etc. Similarly, an OFFSET of 2 indicates that the first two data elements will be transmitted after each of the other banks has transmitted an element. The value of OFFSET can range from 0 to a value that is one less than the number of banks.

Although this description will assume the use of the previously described status indicators, the invention is not limited to only this embodiment. The reordering element requires an indication that the data stream is beginning, the specific pattern (or offset) in which it will be transmitted, and an indication that the data stream has ended. Those skilled in the art would appreciate that these three pieces of information can be supplied in a multitude of different ways, several of which are described above.

Returning to FIG. 5, based on the incoming control information, status logic 210 creates a revised status for each data element. In the preferred embodiment, the following status codes are generated by status logic 210 and stored in control store 201:

| Status Encodings stored with the data in the re-ordering element | |
|---|---|
| SOP_EOP | start of packet and end of packet (only for single word packets) |
| OSOP | first word in multi-word packet - must get converted to MOP or EOP or EOPK at output |
| SOPE | end of packet coming in, but start of packet going out - only valid for a 2 word packet (convert following OSOP into EOP) |
| SOPEK | end of packet (kill) coming in, but start of packet going out - only valid for a 2 word packet (convert following OSOP into EOPK) |
| SOP | start of packet going out (convert following OSOP into MOP) |
| MOP | middle of packet |
| EOP | end of packet |
| MOPE | end of packet coming in, middle of packet going out (convert following MOP into EOP) |
| MOPEK | end of packet (kill) coming in, middle of packet going out (convert following MOP into EOPK) |
| IDLE | no data this cycle |
| EOPK | end of packet that was cut-through and killed. only valid in cut-through implementations |

SOP_EOP has the same significance in this encoding as was previous described. It is used to identify single data element data streams. Those implementations that do not support single data element data streams can eliminate this status indicator.

OSOP indicates that the data element associated with this status was the first element of the current data stream received by the reordering storage element, however it is not truly the first data element in the data stream since the OFFSET value was non-zero. This status will later be converted to a MOP, EOP, or EOPK, depending on the scenario.

SOPE indicates that the data element was the last in the data stream when it was received by the reordering element, but is actually the first data element in the data stream. This status is only used with data streams that contain exactly two data elements. This indicator can be eliminated if two data element data streams are not implemented.

SOPEK indicates that the data element was the last in the data stream when it was received by the reordering element and that the packet should be discarded since it was received in error, but it is actually the first data element in the data stream. This status is only used with data streams that contain exactly two data elements. As is the case with SOPE, this indicator can be eliminated if two data element data streams are not implemented.

SOP indicates that the data element being stored is actually the first element in the data stream. Any subsequent OSOP must be converted into a MOP upon transmission from the reordering element.

MOP indicates that the data element being stored is in the middle of the data stream.

EOP indicates that the data element being stored is the last in the data stream.

MOPE indicates that the data element being stored was the last from that data stream which the reordering element received, but is actually a MOP. In this case, the subsequent MOP must be converted to an EOP.

MOPEK is similar to the MOPE, except that the subsequent MOP is converted into a EOPK.

IDLE indicates that there is no data element.

EOPK indicates that this is the last data element of a data stream that is to be discarded.

This set of indicators allows for a wide variety of data stream sizes, and also allows for "cut-through" implementations, wherein data streams are read out of the banked memory elements before they have been completely received. If the "cut-through" implementation is not allowed, and all packets are greater than two data elements, this set of indicators can be significantly reduced. Under those conditions, only OSOP, SOP, MOP, EOP, MOPE, and IDLE need to be used to implement the present invention.

In the preferred embodiment, the reordering element comprises a FIFO having a read pointer 250 and a write pointer 230. Write pointer 230 is used to index into the FIFO to determine which of the storage elements 200 will be used to store the incoming data from the data path 35. Read pointer 250 is used to determine which of the storage elements 200 will be used to output the next element from the FIFO. As is typical with all FIFOs, a mechanism (not shown) also exists to prevent the FIFO from being written with more data than it can hold. This prevention can be accomplished through the use of a "full" flag, an "almost full" flag, or a FIFO count. Each of these can be used to signal when the FIFO can be longer accept more data. The present invention can operate with any of these embodiments. Additionally, an empty flag 260 is preferably used to indicate when there is no active data currently being stored in the FIFO.

In addition to these typical elements, the FIFO also comprises a write pointer logic element 220. This write pointer logic element 220 uses the incoming status information, such as SOP, MOP, EOP, the OFFSET value and the current value of the write pointer 230 to determine where the next data element should be written. It also uses this information to properly increment and update the write pointer.

The following example illustrates one embodiment of the operation of the reordering element, as well as the use of the read pointer and write pointer. It is assumed, for purposes of illustration, that there are two banks of memory elements which deliver the data to the reordering element. As indicated earlier, there are a number of embodiments which the reordering element could utilize, and the invention is not limited to only this embodiment. In fact, a second somewhat different embodiment is described later to further illustrate the fact that many embodiments of the reordering element are possible and within the scope of the present invention. The following Table 1 describes the 6 data streams which are to be sent to the reordering element:

TABLE 1

| Data Stream | OFFSET (value can only be 0 or 1) | Size (elements) |
|---|---|---|
| 0 | Don't care (0 or 1) | 1 |
| 1 | Yes (1) | 2 |
| 2 | Yes (1) | 3 |
| 3 | Yes (1) | 4 |
| 4 | Yes (1) | 5 |
| 5 | No (0) | 3 |

Data Streams 1 through 4 all have an initial offset, which means that the data elements will arrive as follows: data element 1, data element 0, data element 3, data element 2, etc. Data Stream 5 is correctly ordered, as is Data Stream 0, since it is a stream comprising only a single data element.

Table 2 illustrates the operation of the reordering element. The first column represents the number of the clock cycle during which the specific actions occurred. The next 3 columns, o_in, status_in and din represent the data and associated status information that is being presented to the reordering element.

The next 6 columns, status_enc, wr_addr, data, WP, RP, and E represent the internal storage within the reordering element. Specifically, status_enc is the revised status information generated using the received status_in and o_in information. Wr_addr is the address which is currently being written to. Data represents the stored version of din. WP and RP are the values of the write pointer and read pointer, respectively. Finally, E is an indication that the reordering element is empty.

The remaining 2 columns, status_out and dout represent the status and data as they are output by the reordering element.

Referring to Table 2, during clock cycle 0, a data stream comprising a single element is presented to the reordering element. At this time, the reordering element has no data in it and all of its pointers are reset to 0. Since the reordering element is empty, the E flag is set to 1. Since it is a data stream with a single data element, the SOP_EOP flag is asserted at its input. The reordering element, seeing the SOP_EOP flag, recognizes that the o_in flag is irrelevant and stores the incoming data element at wr_addr 0 and maintains the SOP_EOP status.

During clock cycle 1, no new data is presented to the reordering element, as demonstrated by the incoming status of IDLE. During this clock cycle, the WP is incremented since wr_addr 0 already contains data. Similarly, the E flag is reset, since the reordering element is no longer empty, since the WP and RP no longer have the same value. Since the reordering element is not empty, it can output the data element pointed at by RP. Thus, during clock cycle 1, the first data element and its status SOP_EOP are output by the reordering element.

During clock cycle 2, the first data element of the second data stream is presented to the reordering element. The reordering element uses the status_in of SOP, coupled with the o_in of 1 to determine that this is actually the second data element of the data stream. It then utilizes the WP, and adds one to compensate for the fact that this is really the second data element, and stores the data in wr_addr 2. Its associated status is revised to OSOP, indicating that it is the first data element received, but not actually the first data element of the data stream. The RP is also incremented to 1 since a data element has been output from the reordering element during the previous clock cycle. Also during this time, the E flag is again set to 1 since the RP and WP match. Thus, no data can be output from the reordering element.

TABLE 2

| | Input to reordering element | | | Data element storage within reordering element | | | | | | Output from reordering element | |
|---|---|---|---|---|---|---|---|---|---|---|---|
| time | o_in | status_in | din | status_enc | wr addr | data | WP | RP | E | status_out | dout |
| 0 | X | SOP/EOP | 0 | SOP/EOP | 0 | 0 | 0 | 0 | 1 | IDLE | |
| 1 | | IDLE | | | | | 1 | 0 | 0 | SOP/EOP | 0 |
| 2 | 1 | SOP | 1 | OSOP | 2 | 1 | 1 | 1 | 1 | IDLE | |
| 3 | 1 | EOP | 0 | SOPE | 1 | 0 | 1 | 1 | 1 | IDLE | |
| 4 | | IDLE | | | | | 3 | 1 | 0 | SOP | 0 |
| 5 | | IDLE | | | | | 3 | 2 | 0 | EOP | 1 |
| 6 | 1 | SOP | 1 | OSOP | 4 | 1 | 3 | 3 | 1 | IDLE | |
| 7 | 1 | MOP | 0 | SOP | 3 | 0 | 3 | 3 | 1 | IDLE | |
| 8 | 1 | EOP | 2 | EOP | 5 | 2 | 5 | 3 | 0 | SOP | 0 |
| 9 | | IDLE | | | | | 6 | 4 | 0 | MOP | 1 |
| 10 | | IDLE | | | | | 6 | 5 | 0 | EOP | 2 |
| 11 | 1 | SOP | 1 | OSOP | 7 | 1 | 6 | 6 | 1 | IDLE | |
| 12 | 1 | MOP | 0 | SOP | 6 | 0 | 6 | 6 | 1 | IDLE | |
| 13 | 1 | MOP | 3 | MOP | 9 | 3 | 8 | 6 | 0 | SOP | 0 |
| 14 | 1 | EOP | 2 | MOPE | 8 | 2 | 8 | 7 | 0 | MOP | 1 |
| 15 | | IDLE | | | | | 10 | 8 | 0 | MOP | 2 |
| 16 | | IDLE | | | | | 10 | 9 | 0 | EOP | 3 |
| 17 | 1 | SOP | 1 | OSOP | 11 | 1 | 10 | 10 | 1 | IDLE | |
| 18 | 1 | MOP | 0 | SOP | 10 | 0 | 10 | 10 | 1 | IDLE | |
| 19 | 1 | MOP | 3 | MOP | 13 | 3 | 12 | 10 | 0 | SOP | 0 |
| 20 | 1 | MOP | 2 | MOP | 12 | 2 | 12 | 11 | 0 | MOP | 1 |
| 21 | 1 | EOP | 4 | EOP | 14 | 4 | 14 | 12 | 0 | MOP | 2 |
| 22 | | IDLE | | | | | 15 | 13 | 0 | MOP | 3 |
| 23 | | IDLE | | | | | 15 | 14 | 0 | EOP | 4 |
| 24 | 0 | SOP | 0 | SOP | 15 | 0 | 15 | 15 | 1 | IDLE | |
| 25 | 0 | MOP | 1 | MOP | 16 | 1 | 16 | 15 | 0 | SOP | 0 |
| 26 | 0 | EOP | 2 | EOP | 17 | 2 | 17 | 16 | 0 | MOP | 1 |
| 27 | | IDLE | | | | | 18 | 17 | 0 | EOP | 2 |
| 28 | | IDLE | | | | | 18 | 18 | 1 | IDLE | |

During clock cycle 3, the second data element of the second data stream is presented to the reordering element. The reordering element uses the status_in of EOP, the o_in of 1, coupled with the fact that the previous data element's incoming status was SOP, to determine that the status_enc for this element should be SOPE, which indicates that it was the last data element from the data stream that was received, but is actually the first data element in a data stream comprising only 2 data elements. Since this data element actually should be before the previous one, it is stored at wp_addr 1.

During clock cycle 4, no new data streams are presented to the reordering element, as indicated by a status_in of IDLE. The WP is also incremented by two to a value of 3, since both wp_addr 1 and 2 have been utilized already. Since WP and RP are different, the reordering element is free to output data again, starting at the address indicated by RP. Since the status_enc of that data element is SOPE, the reordering element recognizes that this data element is the first data element of the data stream, and the next data element (the element at RP 2) is the last element of the data stream. Thus, the status_out generated is SOP.

During clock cycle 5, no new data streams are presented to the reordering element, as indicated by a status_in of IDLE. The RP is incremented since a data element was output during the previous clock cycle. WP and RP are still different; therefore, the reordering element is free to output data again, starting at the address indicated by RP. Since the status_enc of that data element is OSOP, and the status_enc of the previous data element was SOPE, the reordering element recognizes that this data element is the last data element of the data stream. Thus, the status_out generated is EOP.

During clock cycle 6, the actions are similar to those occurring during clock cycle 2. The reordering element uses the status_in of SOP, coupled with the o_in of 1 to determine that this is actually the second data element of the data stream. It then utilizes the WP, and adds one to compensate for the fact that this is really the second data element, and stores the data in wr_addr 4. Its associated status is revised to OSOP, indicating that it is the first data element received, but not actually the first data element of the data stream. The RP is also incremented to 3 since a data element has been outputted from the reordering element during the previous clock cycle. Also during this time, the E flag is again set to 1 since the RP and WP match. Thus, no data can be output from the reordering element.

During clock cycle 7, the second data element of the second data stream is presented to the reordering element. The reordering element uses the status_in of MOP, the o_in of 1, coupled with the fact that the previous data element's incoming status was SOP, to determine that the status_enc for this element should be SOP, which indicates that it is actually the first data element in a data. Since this data element actually should be before the previous one, it is stored at wp_addr 3.

During clock cycle 8, the status_in indicates that this is the last data element which will be received in the current data stream. Since the o_in flag is set, the reordering element recognizes that data elements are sent out of order. Therefore, this element may or may not be truly the last element. To determine whether it truly is, in this scenario, the reordering element compares the number of the data element (in this case it is the third element) to the number of banks. If the number of the data element is a perfect multiple of the number of banks, and the o_in flag is set, then this is not truly the last data element (as seen during clock cycle 14). In this case, 3 is not a multiple of 2 and therefore, this truly is the last data element. Thus, the status_enc stays EOP. The WP is also incremented by 2, to become 5. Since the RP and WP are no longer equal, E is now updated to 0 and the reordering element can begin to output data. The data at RP 3 is output first, with a status_out of SOP.

During clock cycle 9, no new data is presented. The RP is incremented to 4, and the next data element is output. This element had a status_enc of OSOP. Since it follows a SOP (and not a SOPE), its status_out is changed to MOP before it is sent.

During clock cycle 10, no new data is presented. The RP is incremented to 5, and the next data element is output. This element had a status_enc of EOP, which remained unaltered as it is sent. Clock cycles 11 and 12 closely mirror time periods 6 and 7 and need not be described again.

During clock cycle 13, the third data element of a data stream comprising four data elements arrives, having a status_in of MOP. Since it is not following a SOP, the status_enc remains MOP. Also, at this time, the WP and RP are different; therefore the data element at RP 6 can be sent, with a status_out of SOP.

During clock cycle 14, the fourth data element arrives with a status_in of EOP. As described in connection with clock cycle 8, the reordering element compares the number of the data element (in this case 4) with the number of banks (2). Since it is a perfect multiple, the reordering element determines that this is not actually the last data element; rather the previously received data element was. Thus, its status_enc is set to MOPE, which indicates that it is really the data element before the EOP.

During clock cycle 15, the reordering element sends the data element at RP 8 (which has a status_enc of MOPE). This is modified to a status_out of MOP as it is sent. However, this status_enc also informs the reordering element that the next data element will have a status_out of EOP, as is shown during clock cycle 16.

The remaining clock cycles illustrate more transactions, using the same principles and rules explained above and therefore need not be described in detail.

Based on the definitions and descriptions given above, a reordering element can be implemented. The pseudo-code that follows illustrates one embodiment of the reordering element, specific to implementations having exactly two banks. The following code uses the same nomenclature as was used in Table 2. Registered states are identified by the suffix "_mr". Combinatorial signals which serve as the inputs to these registers will have the same name, without the "_mr" suffix.

The following pseudo-code contains numerous comments to further explain its operation.

```
// inputs to write logic
  input status_in;          // status from the data source
  input o_in;               // offset status from the source
  input din;                // data from the data source
  // outputs used to store information within the
  //reordering element (for the write logic)
  output ram_wen;                    // write-enable to the RAM
  //within the reordering element
  output ram_waddr;                  // write address to the RAM
  //within the reordering element
  output ram_data;                   // write data to the RAM
  //within the reordering element
  // traditional regs to write logic
  reg wp_mr;                         // write-pointer
  reg wc_mr;                         // element count modulo
  // 2 (which is the number of banks)
  reg last_write_status_mr;          // status of the last
  // element written to the RAM
  // interface to RAM (for the read logic)
  output ram_raddr;                  // read address for the RAM
  input ram_dout;                    // read data from the RAM
```

-continued

```
// inputs to the read logic
input full;                          // indicates when the
// reordering element is full
input dest_accept;                   // flow control from the
// destination
// outputs from the reordering element to the
// destination
output data_out;                     // data from the reordering element
output status_out;                   // modified status created as the
// data is sent from the reordering element
// registers to read logic
reg rp_mr;                           // read pointer
reg last_read_status_mr;             // status of the last word
// read from the RAM
// Having defined all of the registers, inputs and outputs,
// the pseudo-code for the write logic now follows. This
// pseudo-code generates the status_enc for each incoming
// data element based on the o_in and status_in indicators.
// It also determines the proper location at which to write
// the incoming data element. Finally, it updates the write
// pointer (WP) as necessary.
        //
        // Reordering element write logic
        //
        // track the data element count of the current data
        // stream modulo 2 (since there are two banks)
        // each time a SOP or SOP_EOP is received, reset
        // the count at the beginning of every packet
        if ((status_in == SOP) || (status in == SOP EOP)) ||
            wc = 0;
        else
        // increment the count with each valid data element
            if ((status_in == MOP) || (status_in == EOP) ||
            (status_in == EOPK))
                wc = ~wc_mr;
        // hold the old value if there is not a valid data
        // word (such as during an IDLE)
            else
                wc = wc_mr;
        // determine when an element within a stream is
        // entering the reordering element
        nonidle_in = (status_in != IDLE);
        // encode the status that is stored in the
        // reordering element
        // If the stream is sent in the correct order, then
        // the status is unchanged
        if (~o_in)
            status_enc = status_in;
        else
//      here, the elements are out of order and need the
//      status needs to be modified before it is written
//      into the reordering element. The following rules
//      are used:
1.      a status of SOP_EOP is never changed since it is
        the only element of the stream
2.      a status of SOP are always changed to OSOP
3.      a status of MOP can become an SOP if the previous
        element was an OSOP; otherwise, it remains MOP
4.      a status of EOP can become a SOPE if this stream
        has only two elements; if the element count is a
        multiple of the number of banks, then an EOP
        becomes a MOPE; otherwise it remains an EOP
5.      a status of EOPK can become SOPEK, MOPEK,
        or EOPK, following the same rules as described
        for EOP
6.      Otherwise, the status_enc is IDLE
            case (status_in)
                SOP_EOP     : status_enc = SOP_EOP;
                SOP         : status_enc = OSOP;
                MOP         : if (last_write_status_mr == SOP)
                                  status_enc = SOP;
                              else
                                  status_enc = MOP;
                EOP         : if (last_write_status_mr == SOP)
                                  status_enc = SOPE;
                              else
                                  if (wc)
                                      status_enc = MOPE;
                                  else
                                      status_enc = EOP;
                EOPK        : if (last_write_status_mr == SOP)
                                  status_enc = SOPEK;
                              else
                                  if (wc)
                                      status_enc = MOPEK;
                                  else
                                      status_enc = EOPK;
                default     : status_enc = IDLE;
            endcase
        // write the data to the reordering element anytime
        // there is non-idle data from the data source
        ram_wen = (status_in != IDLE);
        // use the write pointer when packet is in-order OR
        // the packet is out-of-order and an odd data
        // element OR the packet is out-of-order, an even
        // data element, and the last element in the stream
        if (~o_in || (o_in & wc) || (o_in & ~wc &
((status_in == EOP) || (status_in == EOPK))))
            ram_waddr = wp_mr;
        // use the write pointer, incremented by one when
        // the packet is out-of-order, an even data
        // element, and not the last element. Since the
        // reordering element is a finite size, all adds
        // must be modulo the size of the reordering
        // element (which is defined as RAM_WORDS)
        else
            ram_waddr = (wp_mr + 1)% RAM_WORDS;
        // concatenate the status and the packet data when
        // writing to the RAM. The RAM's width is equal to
        // the width if each data element, plus the number
        // of bits needed to express the encoded status.
        ram_data = {status_enc, din};
        // update the write pointer
        // add one to the pointer when the data comes in
        // order OR
        // when the data is out-of-order,
        // when this is the end of the stream and this is
        // an odd element
        // or when this is the only element in the data
        // stream (SOP_EOP)
        if ((~o_in & (status_in != IDLE)) ||
            (o_in & (status_in == SOP_EOP)) ||
            (o_in & ((status_in == EOP) || (status_in ==
EOPK)) & ~wc))
                wp = (wp_mr + 1) % RAM_WORDS;
        else
            // add two for streams which are received out-
            // of-order after an even element is received
            if (o_in & wc & (status_in != IDLE))
                wp = (wp_mr + 2) % RAM_WORDS;
            // hold the write-pointer value if there is no
            // data coming in
            else
                wp = wp_mr;
        // update the last word status when the packet
        // source is not idle
          if (non_idle_in)
            last_write_status = status_in;
        // hold the last status if there is no data
        // coming in
          else
            last_write_status = last_write_status mr;
// Pseudo-code for the read logic follows. This pseudo-code
// reads data from the reordering element in sequential
// order, and generates the status_out for each outgoing
// data element based on the status_enc indicators. It also
// determines whether the reordering element is empty and
// determines the proper location from which to read the
// outgoing data element. Finally, it updates the read
// pointer (RP) as necessary.
        //
        // Reordering element read logic
        //
        // the reordering element is empty when the read
        // pointer equals the write pointer (and the
        // reordering element is not full)
        empty = (wp_mr == rp_mr) & !full;
        // this generates a new read pointer when necessary
        // the read pointer is incremented when there is
        // data to send and when the output source can
```

-continued

```
        // accept the data
        if (dest_accept & ~empty)
                rp = (rp_mr + 1) % RAM_WORDS;
        // keep the read-pointer value unchanged if nothing
        // is being read
        else
            rp = rp_mr;
        // the ram address is merely the registered read
  pointer
        ram_raddr = rp_mr;
        // take the encoded status out of the RAM
        status_raw =
        ram_dout[RAM_WIDTH-1:RAM_WIDTH-4];
        // if there is data in the reordering element and
        // the destination is accepting it, then extract
        // the status from the RAM
        if (~empty & dest_accept)
        // based on the status_enc and the status of the
//      previous data element that was sent by the
//      reordering element, the status_out of the data
//      leaving the reordering element is created. The
//      following rules are used to generate the
//      status_out:
1.      a status of SOP_EOP is never changed since it is the
        only element of the stream
2.      a status of SOP is never changed since it is the
        first element of the stream
3.      a status of SOPE is changed to SOP since it is the
        first element of the stream
4.      a status of SOPK is changed to SOP since it is the
        first element of the stream
5.      a status of OSOP is always changed, depending on the
        status_out of the data element that preceded it. If
        the previous element was simply a SOP, then the
        status_out becomes MOP. If it was SOPE, then the
        status_out becomes EOP, since it is the last element
        of a data stream comprising only 2 elements. If it
        was SOPEK, then it becomes EOPK. No other situations
        should ever happen
6.      MOPE is always changed to MOP, since this element is
        neither the first nor last element. It is always the
        next-to-last element.
7.      MOPEK is always changed to MOP, since this element
        is neither the first nor last element. It is always
        the next-to-last element.
8.      a status of MOP depends on the status of the
        preceding data element. If the previous element was
        MOP, then this status_out will be MOP, as well. If
        the previous status_out was MOPE, that indicates
        that this is the last data element, so its
        status_out becomes EOP. Similarly, if the previous
        status_out was MOPEK, that indicates that this is
        the last data element, so its status_out becomes
        EOPK.
9.      a status of EOP is never changed
10.      a status of EOPK is never changed.
Otherwise, the status_out is IDLE
          case (status_raw)
                SOP_EOP         : status_out = SOP_EOP;
                SOP             : status_out = SOP;
                SOPE            : status_out = SOP;
                SOPEK           : status_out = SOP;
                OSOP        : case (last_read_status_mr)
                                SOP             : status_out = MOP;
                                SOPE            : status_out = EOP;

                                SOPEK           : status_out = EOPK;
                // the default case should never happen
                                default         : status_out = IDLE;
                                endcase
                MOPE        : status_out = MOP;
                MOPEK       : status_out = MOP;
                MOP         : case (last_read_status_mr)
                                MOP             : status_out = MOP;
                                MOPE            : status_out = EOP;
                                MOPEK           : status_out = EOPK;
                                default         : status_out = MOP;
                                endcase
```

-continued

```
                EOP             : status_out = EOP;
                EOPK            : status_out = EOPK;
                default         : status_out = IDLE;
          endcase
  // send the idle status if the fifo is empty or if
  // it is stalled
  else
            status_out = IDLE;
  // the data element comes straight from the RAM
  data_out = ram_dout[RAM_WIDTH-5:0];
  // maintain the status of the last data element
  // read from the reordering element
  if (~empty & dest_accept)
            last_read_status = status_raw;
  // hold the last status if there is no data coming
  // in
  else
            last_read_status = last_read_status_mr;
```

The following example illustrates the operation of a second embodiment of the reordering element, as well as the use of the read pointer and write pointer. It is assumed, for purposes of illustration, that there are four banks of memory elements which deliver the data to the reordering element. The following Table 3 describes the 4 data streams which are to be sent to the reordering element:

TABLE 3

| Data Stream | OFFSET (value can be 0→3) | Size (elements) |
|---|---|---|
| 0 | Yes (1) | 7 |
| 1 | Yes (2) | 11 |
| 2 | Yes (3) | 8 |
| 3 | No (0) | 6 |

Data Stream 0 has an offset of 1, which means that the data elements will arrive as follows: data element 1, data element 2, data element 3, data element 0, etc. Data Stream 1 has an offset of 2, which means that the data elements will arrive as follows: data element 2, data element 3, data element 0,data element 1, etc. Data Stream 2 has an offset of 3, which means that the data elements will arrive as follows: data element 3, data element 0, data element 1, data element 2, etc. Data Stream 3 is correctly ordered.

Table 4 illustrates the operation of the reordering element. Several additional status indicators are used in this embodiment, due to the addition of 2 more banks. First, a new status_in indicator INV is used to indicate that the data element currently being transmitted is not valid, but additional valid data elements for this data stream are forthcoming. For example, in a data stream comprising 5 data elements with an offset of 1, the data elements will arrive in the following order: data element 1, data element 2, data element 3, data element 0, invalid, invalid, invalid, data element 4. Thus, the reordering element must recognize the need to treat the INV uniquely. The wr_addr logic acts as though the data element is valid, although the data is not actually written to the reordering element. This status differs from IDLE, which does not cause any action on the part of the wr_addr logic. Similarly, several new status_enc indicators are used, specifically MOPE1, MOPE2 and MOPE3. As before, MOPE indicates that the current byte was EOP as it arrived, but is MOP when transmitted. However, since there are now multiple banks, it is imperative to identify how many data elements will follow the MOPE before the true EOP is encountered. In this embodiment, MOPE1 indicates that the next data element is the EOP. MOPE2 indicates that the second data element received after this is the EOP. Finally, MOPE3 indicates that the third data element received after this is the EOP. If the embodiment contained additional banks, additional status_enc indicators can be added. Finally, the status_enc OSOP is not used in this embodiment. By illustrating a second embodiment, it will be clear to those skilled in the art that there are multiple ways in which the reordering element can be physically implemented in order to achieve its desired function.

TABLE 4

| time | O_in | status_in | din | Status_enc | wr addr | data | WP | RP | E | status_out | dout |
|---|---|---|---|---|---|---|---|---|---|---|---|
| 0 | 1 | SOP | 1 | MOP | 1 | 1 | 0 | 0 | 1 | IDLE | |
| 1 | 1 | MOP | 2 | MOP | 2 | 2 | 0 | 0 | 1 | IDLE | |
| 2 | 1 | MOP | 3 | MOP | 3 | 3 | 0 | 0 | 1 | IDLE | |
| 3 | 1 | MOP | 0 | SOP | 0 | 0 | 0 | 0 | 1 | IDLE | |
| 4 | 1 | MOP | 5 | MOP | 5 | 4 | 4 | 0 | 0 | SOP | 0 |
| 5 | 1 | MOP | 6 | MOP | 6 | 6 | 4 | 1 | 0 | MOP | 1 |
| 6 | 1 | INV | X | — | — | — | 4 | 2 | 0 | MOP | 2 |
| 7 | 1 | EOP | 4 | MOPE2 | 4 | 4 | 4 | 3 | 0 | MOP | 3 |
| 8 | 2 | SOP | 2 | MOP | 9 | 2 | 7 | 4 | 0 | MOP | 4 |
| 9 | 2 | MOP | 3 | MOP | 10 | 3 | 7 | 5 | 0 | MOP | 5 |
| 10 | 2 | MOP | 0 | SOP | 7 | 0 | 7 | 6 | 0 | EOP | 6 |
| 11 | 2 | MOP | 1 | MOP | 8 | 1 | 7 | 7 | 1 | IDLE | |
| 12 | 2 | MOP | 6 | MOP | 13 | 6 | 11 | 7 | 0 | SOP | 0 |
| 13 | 2 | MOP | 7 | MOP | 14 | 7 | 11 | 8 | 0 | MOP | 1 |
| 14 | 2 | MOP | 4 | MOP | 11 | 4 | 11 | 9 | 0 | MOP | 2 |
| 15 | 2 | MOP | 5 | MOP | 12 | 5 | 11 | 10 | 0 | MOP | 3 |
| 16 | 2 | MOP | 10 | MOP | 17 | 10 | 15 | 11 | 0 | MOP | 4 |
| 17 | 2 | INV | X | — | — | — | 15 | 12 | 0 | MOP | 5 |
| 18 | 2 | MOP | 8 | MOP | 15 | 8 | 15 | 13 | 0 | MOP | 6 |
| 19 | 2 | EOP | 9 | MOPE1 | 16 | 9 | 15 | 14 | 0 | MOP | 7 |
| 20 | | IDLE | X | — | — | — | 18 | 15 | 0 | MOP | 8 |
| 21 | 3 | SOP | 3 | MOP | 21 | 3 | 18 | 16 | 0 | MOP | 9 |
| 22 | 3 | MOP | 0 | SOP | 18 | 0 | 18 | 17 | 0 | EOP | 10 |
| 23 | 3 | MOP | 1 | MOP | 19 | 1 | 18 | 18 | 1 | IDLE | |
| 24 | 3 | MOP | 2 | MOP | 20 | 2 | 18 | 18 | 1 | IDLE | |
| 25 | 3 | MOP | 7 | MOP | 25 | 7 | 22 | 18 | 0 | SOP | 0 |
| 26 | 3 | MOP | 4 | MOP | 22 | 4 | 22 | 19 | 0 | MOP | 1 |
| 27 | 3 | MOP | 5 | MOP | 23 | 5 | 22 | 20 | 0 | MOP | 2 |
| 28 | 3 | EOP | 6 | MOPE1 | 24 | 6 | 22 | 21 | 0 | MOP | 3 |
| 29 | 0 | SOP | 0 | SOP | 26 | 0 | 26 | 22 | 0 | MOP | 4 |
| 30 | 0 | MOP | 1 | MOP | 27 | 1 | 26 | 23 | 0 | MOP | 5 |
| 31 | 0 | MOP | 2 | MOP | 28 | 2 | 26 | 24 | 0 | MOP | 6 |
| 32 | 0 | MOP | 3 | MOP | 29 | 3 | 26 | 25 | 0 | EOP | 7 |
| 33 | 0 | MOP | 4 | MOP | 30 | 4 | 30 | 26 | 0 | SOP | 0 |
| 34 | 0 | EOP | 5 | EOP | 31 | 5 | 30 | 27 | 0 | MOP | 1 |
| 35 | | IDLE | X | — | — | — | 32 | 28 | 0 | MOP | 2 |
| 36 | | IDLE | X | — | — | — | 32 | 29 | 0 | MOP | 3 |
| 37 | | IDLE | X | — | — | — | 32 | 30 | 0 | MOP | 4 |
| 38 | | IDLE | X | — | — | — | 32 | 31 | 0 | EOP | 5 |
| 39 | | IDLE | X | — | — | — | 32 | 32 | 1 | IDLE | |

Referring to Table 4, the operation of the reordering element in a four bank memory embodiment will be described, although this embodiment can be generalized to support an arbitrary number of banks.

During clock cycle 0, a data element arrives, with an OFFSET of 1. The wr_addr starts with a value of WP+o_in, and will increment this until 3 data elements (this value is calculated as the number of banks (NUM_BANKS) minus o_in) have been received. At that point, the wr_addr will wrap back to WP, where the fourth data element is placed. After 4 (i.e. NUM_BANKS) data elements have been successfully written to the reordering element, the WP is incremented by 4 (again, the number of banks), as shown during clock cycle 4. This sequence repeats a second time as more data elements are received. Note that during clock cycle 6, a status_in of INV is received. The wr_addr logic treats this as though it received actual data, allowing it to correctly register a wr_addr of 4 for the next data element. Without the use of INV, the data element received during clock cycle 7 would have been placed in wr_addr 7, which would have resulted in the stream being out of order. In addition, the INV increments a new internal counter, inv_num, which records the number of invalid data elements received during the current data stream. It is reset whenever an SOP is encountered and incremented whenever an INV is encountered.

During clock cycle 7, a data element with a status_in of EOP is encountered. This signifies that the entire data stream has been received. The status_enc that will be used is based on the number of banks, o_in and inv_num. Specifically, the value of NUM_BANKS−o_in−inv_num is calculated. A value of 0 signifies that this is truly the last data element and the status_enc is EOP. Any non-zero value indicates the numeric value which will follow the MOPE (i.e. MOPE1, MOPE2, and MOPE3). In this scenario, the computed value is given by 4−1−1=2. Thus, a status_enc of MOPE2 is used during clock cycle 7. This computed value is also used to properly increment the WP after the EOP is received. Since the true EOP is 2 data elements after this one, the next available wr_addr is 3 more than the current value. Therefore, WP is set to the current value of wr_addr+(the value computed above+1), as shown in clock cycle 8.

During clock cycle 8, the read logic uses the RP, which is currently set to 4, to index into the reordering element. It then retrieves a data element which has a status_enc of MOPE2. The read logic converts this into a MOP, and loads the value of 2 into a down counter, EOP_cntr. Each subsequent data element will cause this counter to decrement. When the counter EOP_cntr reaches 0, the read logic changes the status_enc from MOP to EOP, as shown during clock cycle 10. Also occurring during this clock cycle is the receipt of a new data stream, as signified by the status_in of SOP. As described above, the write logic begins storing this new data element at wr_addr=WP+o_in.

The following pseudo-code describes the various actions of the reordering element, as they are described above. The following list of signals identifies the inputs, outputs and registers in the pseudo-code. The following pseudo-code is somewhat simplified by assuming that all received data streams are greater than four data elements. Also, it is assumed that cut through is not enabled. One skilled in the art is aware that this embodiment is capable of supporting these situations; it is simply to improve the readability and understanding of the pseudo-code that they have been eliminated.

```
// inputs to write logic
input status_in;          // status from the data source
input o_in;               // offset status from the source
input din;                // data from the data source
// outputs used to store information within the
// reordering element (for the write logic)
output ram_wen;                     // write-enable to the RAM
// within the reordering element
output ram_waddr;                   // write address to the RAM
// within the reordering element
output ram_data;                    // write data to the RAM
// within the reordering element
// traditional regs to write logic
reg wp_mr;                          // write-pointer
reg wc_mr;                // element count modulo
                          (NUM_BANK)
reg inv_cntr_mr;          // number of INV received during
// this data stream
reg SOP_cntr_mr;          //used to determine true SOP
// interface to RAM (for the read logic)
output ram_raddr;                   // read address for the RAM
input ram_dout;                     // read data from the RAM
// inputs to the read logic
input full;                         // indicates when the
// reordering element is full
input dest_accept;                  // flow control from the
// destination
// outputs from the reordering element to the
// destination
output data_out;          // data from the reordering element
output status_out;        // modified status created as the
// data is sent from the reordering element
// registers to read logic
reg rp_mr;                                  // read pointer
reg EOP_cntr_mr;                    // number of data elements
// left before EOP is reached.
reg EOP_cntr_en;                    // enable for EOP_counter
// Pseudo-code for the write logic is as follows. This
// pseudo-code generates the status_enc for each incoming
// data element based on the o_in and status_in indicators.
// It also determines the proper location at which to write
// the incoming data element. Finally, it updates the write
// pointer (WP) as necessary.
        //
        // Reordering element write logic
        //
        // track the data element count of the current data
        // stream modulo (NUM_BANKS)
        // each time a SOP is received, reset the word
        // count and the INV count at the beginning of
        // every packet
        if ((status_in == SOP))
            wc = 0;
        else
    // increment the count with each valid element.
    // Status_in of INV also increments the word count to
    // guarantee that subsequent words are correctly
    // stored. The number of INV received will be counted
    // and taken into account when updating the write
```

-continued

```
    // pointer after an EOP is received.
            if ((status_in == MOP) || (status_in == EOP) ||
    (status_in == INV))
                wc = (wc_mr + 1) % NUM_BANKS;
            // hold the old value if there is not a valid
            // data word (such as during an IDLE)
            else
                wc = wc_mr;
    // track invalid word count of the current packet
    // - reset count at the beginning of every packet
    if (status_in == SOP)
            inv_cntr = 0;
    else
            // inc invalid count with each invalid slot
            // - there will never be more than
            // (NUM_BANKS−1) invalids per packet
            if (status_in == INV)
                inv_cntr = inv_cntr_mr + 1;
            // hold the old value if there is not an invalid
            // data word
            else
                inv_cntr = inv_cntr_mr;
    // determine if this is the first quantum of data
    //      - set the state on a SOP
    //      - hold until NUM_BANKS of data received
    //      - clear when NUM_BANKS of data received
    first_quant = ((status_in == SOP) | first_quant_mr)
    & ~((wc_mr == (NUM_BANKS−1)) &&
    (status_in == MOP));
    // counter to determine the real start of packet
    if (status_in == SOP)
      SOP_cntr = o_in;
    else
      if (status_in == MOP)
          SOP_cntr = SOP_cntr_mr + 1;
      else
          SOP_cntr = SOP_cntr_mr;
    // encode the status that is stored in the
    // reordering element
    // If the stream is sent in the correct order, then
    // the status is unchanged
    if (o_in == 0)
        status_enc = status_in;
    else
      // here, the elements are out of order and need
      // the status to be modified before it is written
      // into the reordering element. The following
      // rules are used:
    1. a status of SOP are always changed to MOP
    2. a status of MOP can become an SOP if it is exactly
       (NUM_BANKS − o_in) after the OSOP; otherwise
       it remains MOP
    3. a status of EOP can become a variant of MOPE,
       depending on the offset and the number of invalids
       received; otherwise it remains an EOP
    4. Otherwise, the status_enc is IDLE
          case (status_in)
              SOP         : status_enc = MOP;
              MOP         : if ((SOP_cntr == 0) & first_quant))
                                status_enc = SOP;
                            else
                                status_enc = MOP;
              EOP         : case (NUM_BANKS −
                            o_in − inv_ctr)
                                0: status_enc = EOP;
                                1: status_enc = MOPE1;
                                2: status_enc = MOPE2;
                                3: status_enc = MOPE3;
                                default: status_enc = EOP;
                            endcase
              default     : status_enc = IDLE;
          endcase
          // write the data to the reordering element anytime
          // there is data from the data source
          ram_wen = ((status_in != IDLE) && (status_in !=
    INV));
      // use the write pointer, incremented by (o_in +
    // wc) MODULO (NUM_BANKS).
          ram_waddr =
          (wp_mr + ((o_in + wc) % NUM_BANKS) %
```

-continued

```
RAM_WORDS);
    // concatenate the status and the packet data when
    // writing to the RAM
    ram_data = {status_enc, din};
    // update the write pointer
    // add NUM_BANKS to the pointer,
    when a multiple of
    // NUM_BANKS elements have been received.
    // add wc − inv_ctr + 1 to the write pointer when
    // an EOP is received.
    if ((status_in == MOP) &&
    (wc == (NUM_BANKS − 1)))
        wp =
        (wp_mr + NUM_BANKS) % RAM_WORDS;
    else
        // add enough to reach the true EOP once a
        // status_in of EOP is received. The amount to
        // be added to the current WP is given by wc -
        // inv_cntr_mr + 1.
        if (status_in == EOP)
            wp = (wp_mr + wc − inv_cntr_mr + 1) %
    RAM_WORDS;
        // hold the write-pointer value if neither of
        // these conditions apply
        else
            wp = wp_mr;
// Pseudo-code for the read logic is as follows. This
// pseudo-code generates the status_out for each outgoing
// data element based on the status_enc indicators. It also
// determines whether the reordering element is empty and
// determines the proper location from which to read the
// outgoing data element. Finally, it updates the read
// pointer (RP) as necessary.
    //
    // Reordering element read logic
    //
    // the reordering element is empty when the read
    // pointer equals the write pointer (and the fifo
    // is not full)
    empty (wp_mr == rp_mr) & !full;
    // this generates a new read pointer when necessary
    // the read pointer is incremented when there is
    // data to send and when the output source can
    // accept the data
    if (dest_accept & ~empty)
    rp = (rp_mr + 1) % RAM_WORDS;
    // keep the read-pointer value unchanged if nothing
    // is being read
    else
    rp = rp_mr;
    // the ram address is merely the registered read
    // pointer
    ram_raddr = rp_mr;
    // take the encoded status out of the RAM
    status_raw =
    ram_dout[RAM_WIDTH-1:RAM_WIDTH-4];
    // if there is data in the reordering element and
    // the destination is accepting it, then extract
    // the status from the RAM
    if (~empty & dest_accept)
    // based on the status_enc and the status of the
    // previous data element that was sent by the
    // reordering element, the status_out of the data
    // leaving the reordering element is created. The
    // following rules are used to generate the
    // status_out:
  1. a status of SOP is never changed since it is the
     first element of the stream
  2. MOPE1, MOPE2 and MOPE3 are always changed to
     MOP, since these elements are neither the first nor last
     element. They indicate that the EOP is approaching.
     It is always the next-to-last element.
  3. a status of MOP depends on the status of the
     EOP_cntr. When the number of elements indicated by
     the MOPE status have been transferred, the next MOP
     will be changed to an EOP. The EOP_cntr is used to
     correctly calculate the proper data element whose
     status should be altered. If it is not converted to
     an EOP, its status will remain MOP. Before the
     MOPE is received, all MOP remain unchanged.
```

-continued

```
Otherwise, the status_out is IDLE
    case (status_raw)
        SOP         : begin
                          EOP_cntr_en = 0;
                          EOP_cntr = 0;
                          status_out = SOP;
                      end
        MOPE1       : begin
                          EOP_cntr_en = 1;
                          EOP_cntr = 1;
                          status_out = MOP;
                      end
        MOPE2       : begin
                          EOP_cntr_en = 1;
                          EOP_cntr = 2;
                          status_out = MOP;
                      end
        MOPE3       : begin
                          EOP_cntr_en = 1;
                          EOP_cntr = 3;
                          status_out = MOP;
                      end
        MOP         : begin
                          if (EOP_cntr_en_mr)
                          begin
                              EOP_cntr =
                              EOP_cntr_mr − 1;
                              if (EOP_cntr == 0)
                              begin
                                  EOP_cntr_en = 0;
                                  status_out = EOP;
                              end
                              else
                              begin
                                  EOP_cntr_en = 1;
                                  status_out = MOP;
                              end
                          end
                          else
                          begin
                              EOP_cntr_en = 0;
                              EOP_cntr = 0;
                              status_out = MOP;
                          end
                      end
        EOP         : begin
                          EOP_cntr_en = 0;
                          EOP_cntr = 0;
                          status_out = EOP;
                      end
        default     : begin
                          EOP_cntr_en = 0;
                          EOP_cntr = 0;
                          status_out = IDLE;
                      end
    endcase
  // send the idle status if the fifo is empty or if
  // it is stalled
  else
  begin
      EOP_cntr_en = 0;
      EOP_cntr = 0;
      status_out = IDLE;
  end
  // the data element comes straight from the RAM
  data_out = ram_dout[RAM_WIDTH-5:0];
```

While two embodiments are illustrated and explained in this specification, other embodiments are within the scope of the present invention. Similarly, although the embodiments described two and four banked memory architectures, the invention is not so limited. An arbitrary number of banks can be used in conjunction with the present invention.

Figure 6:
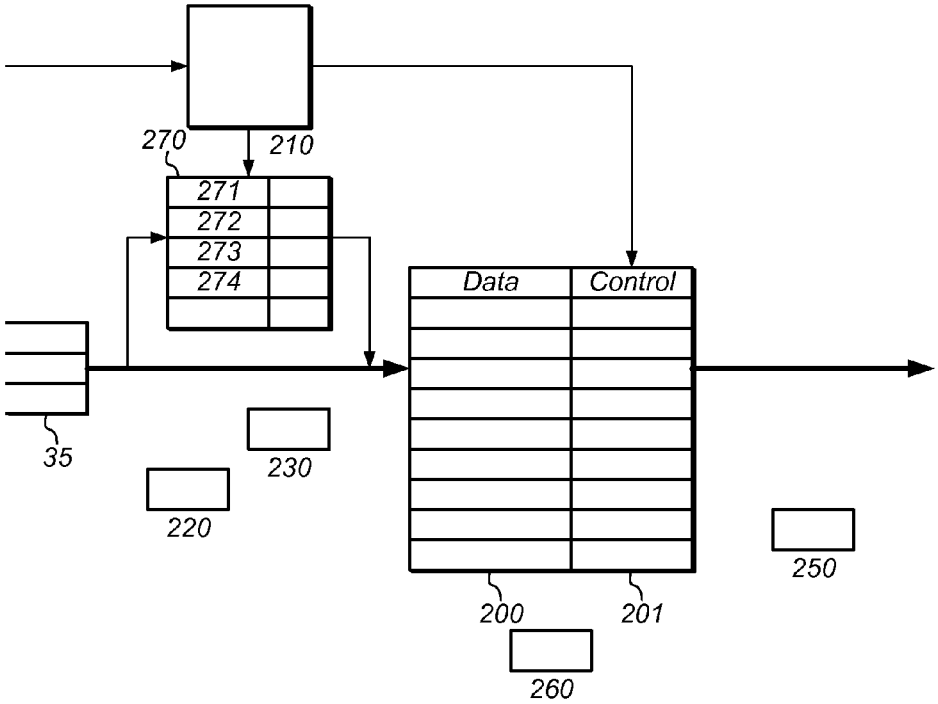
FIG. 6 illustrates a second representative embodiment of the re-ordering element of the present invention.

The reordering element can also be implemented using a main storage element, and an auxiliary holding buffer 270 as illustrated in FIG. 6. The data paths 35 from the banked memory elements are in communication with the reordering storage elements 200 and the auxiliary holding buffer 270. The auxiliary holding buffer 270 must be capable of storing N−1 data elements, where N is the number of banks. In the preferred implementation, the auxiliary holding buffer 270 is capable of storing a new data element while simultaneously presenting a data element to the reordering storage element 200.

When a new packet is being transmitted, as indicated by an incoming status of SOP, the OFFSET value is checked. If the packet is being sent in the proper order, as determined by an OFFSET value of 0, the auxiliary holding buffer 270 is bypassed and the data elements are stored directly in the reordering storage element 200 in sequential order.

However, if the OFFSET is non-zero, this indicates that the data elements will be arriving out of order. The write pointer logic 220 will store the first M data elements sequentially in the holding buffer 270, where M is the number of banks minus the OFFSET. For example, if there are 4 banks with an OFFSET of 1, the data elements will arrive as data element 1, data element 2, data element 3, data element 0, data element 5, etc. Thus, the holding buffer 270 must store three elements (data elements 1-3) in locations 271, 272 and 273 before the true first data element arrives. Similarly, if the OFFSET is 3, the write pointer logic would store one data element in the holding buffer 270 at location 271.

Once the write pointer logic 220 has stored M data elements in the holding buffer, it enables the next data element to be written directly to the reordering storage element 200, since this is the true first data element. A number of data elements, equal to the value of the OFFSET, are written directly to the reordering element sequentially. For example, if the OFFSET is 1, only a single data element is written directly to the reordering storage element 200. If the OFFSET is 3, then three data elements are written directly to the reordering storage element 200. After this number of data elements has been written directly to the reordering element, the write pointer control logic 220 then redirects the next data element to location 271 in the holding buffer 270. Simultaneous with the writing of the next data element into location 271, the current contents of location 271 in the holding buffer are transferred to the next sequential address in the reordering element 200, as represented by the write pointer 230. While each of the next M data elements are being stored in the holding buffer 270, the contents of the location in the holding buffer that are being overwritten are transferred to the reordering element. This process repeats until the EOP is received. Table 5 shows the operation of the reordering storage element 200, in conjunction with the holding buffer 270.

As can be seen during time periods 13 and 14, this implementation requires idle time between packets with different offsets. Specifically, when a packet with an offset is followed by a packet with a higher offset (or an offset of 0), there may need to be idle cycles inserted to allow the contents of the holding buffer to be transferred to the reordering element. For non-zero offset values, the maximum number of idle cycles required is defined as the new offset value minus the previous offset value. If the new offset value is zero, the maximum number of idle cycles is defined as the number of banks, less the previous offset value. This wait time can be less, depending on the number of data elements currently in the holding buffer when an EOP is received.

TABLE 5

| time | O_in | status_in | din | Holding Buffer Address | Holding Buffer Data | Reordering Element Data Source | WP | Data |
|---|---|---|---|---|---|---|---|---|
| 0 | 0 | SOP | 0 | — | — | Banked memory | 0 | 0 |
| 1 | 0 | MOP | 1 | — | — | Banked memory | 1 | 1 |
| 2 | 0 | MOP | 2 | — | — | Banked memory | 2 | 2 |
| 3 | 0 | MOP | 3 | — | — | Banked memory | 3 | 3 |
| 4 | 0 | EOP | 4 | — | — | Banked memory | 4 | 4 |
| 5 | 1 | SOP | 1 | 0 | 1 | — | 4 | — |
| 6 | 1 | MOP | 2 | 1 | 2 | — | 4 | — |
| 7 | 1 | MOP | 3 | 2 | 3 | — | 4 | — |
| 8 | 1 | MOP | 0 | — | — | Banked Memory | 5 | 0 |
| 9 | 1 | MOP | 5 | 0 | 5 | Holding Buffer(0) | 5 | 1 |
| 10 | 1 | MOP | 6 | 1 | 6 | Holding Buffer(1) | 6 | 2 |
| 11 | 1 | MOP | 7 | 2 | 7 | Holding Buffer(2) | 7 | 3 |
| 12 | 1 | EOP | 4 | — | — | Banked Memory | 8 | 4 |
| 13 | — | IDLE | X | — | — | Holding Buffer(0) | 9 | 5 |
| 14 | — | IDLE | X | — | — | Holding Buffer(1) | 10 | 6 |
| 15 | 3 | SOP | 3 | 0 | 3 | Holding Buffer(2) | 11 | 7 |
| 16 | 3 | MOP | 0 | — | — | Banked Memory | 12 | 0 |
| 17 | 3 | MOP | 1 | — | — | Banked Memory | 13 | 1 |
| 18 | 3 | MOP | 2 | — | — | Banked Memory | 14 | 2 |
| 19 | 3 | MOP | 7 | 0 | 7 | Holding Buffer(0) | 15 | 3 |
| 20 | 3 | MOP | 4 | — | — | Banked Memory | 16 | 4 |
| 21 | 3 | MOP | 5 | — | — | Banked Memory | 17 | 5 |
| 22 | 3 | MOP | 6 | — | — | Banked Memory | 18 | 6 |
| 23 | 3 | INV | X | — | — | Holding Buffer(0) | 19 | 7 |
| 24 | 3 | MOP | 8 | — | — | Banked Memory | 20 | 8 |
| 25 | 3 | EOP | 9 | — | — | Banked Memory | 21 | 9 |
| 26 | 2 | SOP | 2 | 0 | 2 | — | 21 | — |
| 27 | 2 | MOP | 3 | 1 | 3 | — | 21 | — |
| 28 | 2 | MOP | 0 | — | — | Banked Memory | 22 | 0 |
| 29 | 2 | MOP | 1 | — | — | Banked Memory | 23 | 1 |
| 30 | 2 | MOP | 6 | 0 | 6 | Holding Buffer(0) | 24 | 2 |
| 31 | 2 | MOP | 7 | 1 | 7 | Holding Buffer(1) | 25 | 3 |
| 32 | 2 | MOP | 4 | — | — | Banked Memory | 26 | 4 |
| 33 | 2 | MOP | 5 | — | — | Banked Memory | 27 | 5 |
| 34 | 2 | MOP | 10 | 0 | 10 | Holding Buffer(0) | 28 | 6 |
| 35 | 2 | INV | X | — | — | Holding Buffer(1) | 29 | 7 |
| 36 | 2 | MOP | 8 | — | — | Banked Memory | 30 | 8 |
| 37 | 2 | EOP | 9 | — | — | Banked Memory | 31 | 9 |
| 38 | | IDLE | X | — | — | Holding Buffer(0) | 32 | 10 |
| 39 | | IDLE | X | — | — | — | | — |

Figure 7:
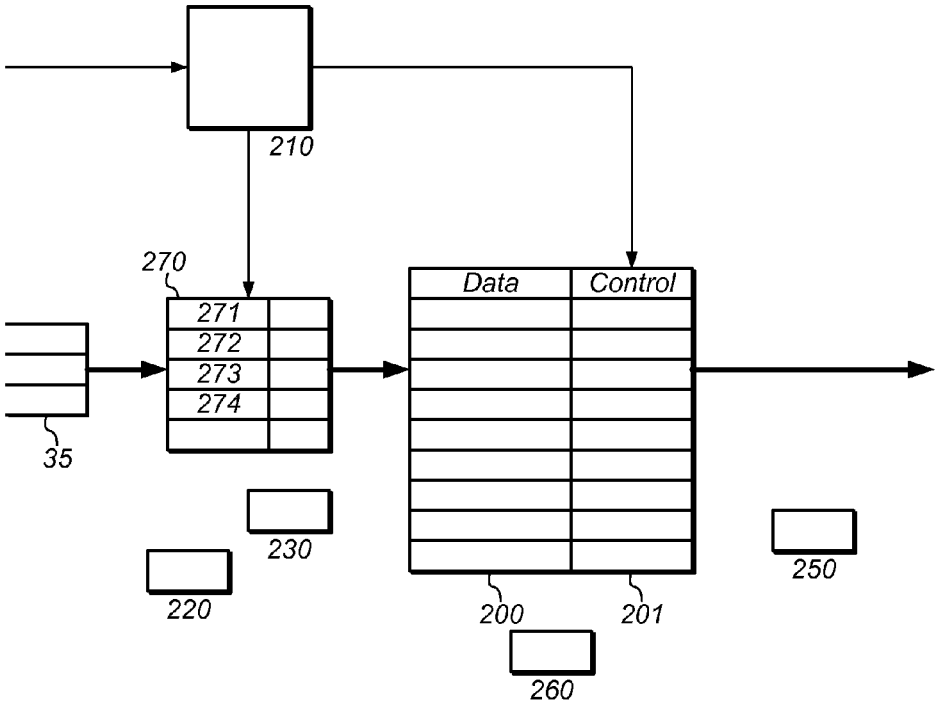
FIG. 7 illustrates a third representative embodiment of the re-ordering element of the present invention.

In an alternate embodiment, shown in FIG. 7, the holding buffer 270 is used to store all data elements before they are written sequentially to the reordering element. In this case, the reordering element 200 receives its input from the holding buffer 270, and all data elements are stored in the holding buffer 270 before being ultimately stored in the reordering element. The reordering element stores items in sequential order. In one implementation, the holding buffer acts as a parallel load/shift register, in which the contents of address 271 (HBA0 in Table 6) are presented as the input to the reordering element. Each of the locations in the holding buffer 271-274 (HBA0-HBA3) can receive their input either from the adjacent holding buffer location, or from the banked memory elements. Each of the locations within the holding buffer 271-274 are capable of storing and outputting data during the same clock cycle. Alternatively, a linked list structure can be used. Table 6 illustrates the operation of one implementation of this embodiment. In this embodiment, HBA0 provides the input to the reordering element. The inputs to HBA0-HBA2 are either from the holding buffer location immediately to the left in Table 6, or from the banked memory (denoted as din in Table 6), while the input to HBA3 can only come from the banked memory. During each clock cycle, the current contents of a holding buffer location 271-274 can either remain unchanged, or shift to the location immediately to the right as shown in Table 6. It is obvious to one skilled in the art that there are multiple implementations in which this result can be achieved, and the present invention is not limited only to the embodiment described above.

TABLE 6

| time | O_in | status_in | din | HBA 3 | HBA 2 | HBA 1 | HBA 0 | WP | Data |
|---|---|---|---|---|---|---|---|---|---|
| 0 | 0 | SOP | 0 | — | — | — | 0 | — | — |
| 1 | 0 | MOP | 1 | — | — | — | 1 | 0 | 0 |
| 2 | 0 | MOP | 2 | — | — | — | 2 | 1 | 1 |
| 3 | 0 | MOP | 3 | — | — | — | 3 | 2 | 2 |
| 4 | 0 | EOP | 4 | — | — | — | 4 | 3 | 3 |
| 5 | 1 | SOP | 1 | | | 1 | — | 4 | 4 |
| 6 | 1 | MOP | 2 | | 2 | 1 | — | 4 | — |
| 7 | 1 | MOP | 3 | 3 | 2 | 1 | — | 4 | — |
| 8 | 1 | MOP | 0 | 3 | 2 | 1 | 0 | 4 | — |
| 9 | 1 | MOP | 5 | 5 | 3 | 2 | 1 | 5 | 0 |
| 10 | 1 | MOP | 6 | 6 | 5 | 3 | 2 | 6 | 1 |
| 11 | 1 | MOP | 7 | 7 | 6 | 5 | 3 | 7 | 2 |
| 12 | 1 | EOP | 4 | 7 | 6 | 5 | 4 | 8 | 3 |
| 13 | 3 | SOP | 3 | 3 | 7 | 6 | 5 | 9 | 4 |
| 14 | 3 | MOP | 0 | 3 | 0 | 7 | 6 | 10 | 5 |
| 15 | 3 | SOP | 1 | 3 | 1 | 0 | 7 | 11 | 6 |
| 16 | 3 | MOP | 2 | 3 | 2 | 1 | 0 | 12 | 7 |
| 17 | 3 | MOP | 7 | 7 | 3 | 2 | 1 | 13 | 0 |
| 18 | 3 | MOP | 4 | 7 | 4 | 3 | 2 | 14 | 1 |
| 19 | 3 | MOP | 5 | 7 | 5 | 4 | 3 | 15 | 2 |
| 20 | 3 | MOP | 6 | 7 | 6 | 5 | 4 | 16 | 3 |
| 21 | 3 | INV | X | — | 7 | 6 | 5 | 17 | 4 |
| 22 | 3 | MOP | 8 | — | 8 | 7 | 6 | 18 | 5 |
| 23 | 3 | EOP | 9 | — | 9 | 8 | 7 | 19 | 6 |
| 24 | 2 | SOP | 2 | 2 | — | 9 | 8 | 20 | 7 |
| 25 | 2 | MOP | 3 | 3 | 2 | — | 9 | 21 | 8 |
| 26 | 2 | MOP | 0 | — | 3 | 2 | 0 | 21 | 9 |
| 27 | 2 | MOP | 1 | — | 3 | 2 | 1 | 21 | 0 |
| 28 | 2 | MOP | 6 | — | 6 | 3 | 2 | 22 | 1 |
| 29 | 2 | MOP | 7 | — | 7 | 6 | 3 | 23 | 2 |
| 30 | 2 | MOP | 4 | — | 7 | 6 | 4 | 24 | 3 |
| 31 | 2 | MOP | 5 | — | 7 | 6 | 5 | 25 | 4 |
| 32 | 2 | MOP | 10 | 10 | — | 7 | 6 | 26 | 5 |
| 33 | 2 | INV | X | 10 | — | — | 7 | 27 | 6 |
| 34 | 2 | MOP | 8 | — | 10 | — | 8 | 28 | 7 |
| 35 | 2 | EOP | 9 | — | — | 10 | 9 | 29 | 8 |
| 36 | | IDLE | X | — | — | — | 10 | 30 | 9 |
| 37 | | IDLE | X | — | — | — | — | 31 | 10 |
| 38 | | IDLE | X | | | | — | 31 | — |
| 39 | | IDLE | X | | | | — | | — |

What is claimed:

1. A device for receiving and storing a data stream comprising a plurality of data elements, transmitted in a predetermined sequence, and later retransmitting said data elements in said predetermined sequence, said device comprising:

a plurality of storage elements, wherein each of said storage elements selectively receives and stores a portion of said data elements in a first ordered sequence;

a logic element, wherein said logic element generates and stores information associated with said data stream, and generates and transmits status information associated with each of said stored data elements based on said information associated with said data stream; and a reordering element, wherein said reordering element receives said stored data elements from said plurality of storage elements and said associated status information from said logic element in a second ordered sequence, stores said data elements and retransmits said data elements in said predetermined sequence.

2. The device of claim 1, wherein said first and said second ordered sequences are the same.

3. The device of claim 1, wherein said status information comprises information related to the relative position of said data element in said stream.

4. The device of claim 1, wherein said first ordered sequence is repeated after each one of said plurality of storage elements receives one data element from said stream.

5. The device of claim 1, wherein said second ordered sequence is repeated after said reordering element receives one data element from each one of said plurality of storage elements.

6. The device of claim 1, wherein said reordering element creates revised status information based on said status information, and stores said revised status information.

7. The device of claim 1, wherein said reordering element further comprises a plurality of individually addressable storage elements and a write control logic element adapted to determine into which of said plurality of individually addressable storage elements said stored data element is stored based on said associated status.

8. The device of claim 1, wherein said reordering element further comprises a first plurality of individually addressable storage elements, a second plurality of individually addressable storage elements and a write control logic element adapted to determine into which plurality of individually addressable storage elements said stored data element is stored based on said second ordered sequence in which said stored data elements are received, wherein said first plurality receives data elements from said second plurality and from said storage elements in said predetermined sequence.

9. The device of claim 1, wherein said reordering element further comprises a first plurality of individually addressable storage elements, a second plurality of individually addressable storage elements and a write control logic element adapted to determine into which storage element of said second plurality said data element is to be stored, and wherein said first plurality of addressable storage elements receives data elements from said second plurality of addressable storage elements in said predetermined sequence.

10. A method of receiving and storing a data stream comprising a plurality of data elements, transmitted in a predetermined sequence, and later retransmitting said data elements in said predetermined sequence, said method comprising:

a. providing a plurality of storage elements, each adapted to selectively receive and store a portion of said data elements, and a reordering element adapted to receive said stored data elements from said plurality of storage elements and to transmit said data elements in said predetermined sequence;

b. storing a sequential data element from said stream in one of said storage elements according to a first order;

c. repeating step b until each of said plurality of said data elements has stored one data element;

d. selectively storing each of the subsequent data elements in said plurality of storage elements, following said first order of said storage elements as utilized in steps b and c;

e. transmitting a stored data element from one of said storage elements to said reordering element, whereby said storage element is selected based on a second order, and storing said stored data element in said reordering element;

f. repeating step e until each of said storage elements has transmitted one data element;

g. selectively transmitting each of the remaining stored data elements from said plurality of storage elements, following said second order as utilized in steps e and f until each of said stored data elements associated with said stream has been stored by said reordering element; and h. retransmitting said stored data elements from said reordering element in said predetermined sequence.

11. The method of claim 10, further comprising: providing a logic element adapted to create and store control information associated with said data stream and to generate status information associated with each of said stored data elements based on said control information.

12. The method of claim 11, wherein said reordering element receives said status information, and generates and stores revised control information associated with each data element.

13. The method of claim 11, wherein said reordering element receives said data elements in said second sequence and uses said associated status information to reorder said data elements into said predetermined sequence.

*14. A device, comprising:*

*a plurality of storage elements; and*

*a reordering element;*

*wherein the device is configured to:*

*receive, via a network, a data stream having data elements that have been transmitted in an original sequence;*

*store data elements in the received data stream to ones of the plurality of storage elements according to a first ordering that is based, at least in part, on respective portions of a recurring time interval in which the data elements are received; and*

*generate information associated with the data stream;*

*wherein the reordering element is configured to receive, according to a second ordering, the stored data elements along with the generated information associated with the data stream, and wherein the reordering element is configured to output the received data elements in the original sequence.*

*15. The device of claim 14, wherein the first and second orderings are the same.*

*16. The device of claim 14, wherein at least first and second ones of the data elements are respectively stored in first and second ones of the plurality of storage elements based on the first and second data elements being respectively received in first and second ones of the different time intervals.*

*17. The device of claim 14, wherein a speed at which the device is configured to receive the data stream is greater than a speed with which one or more storage elements in the plurality of storage elements are capable of storing data.*

*18. The device of claim 14, wherein the generated information associated with the data stream includes information identifying a data element that is first in the original sequence and information identifying a data element that is last in the original sequence.*

*19. The device of claim 14, wherein the generated information includes information indicating one of the plurality of storage elements to which a first-received one of the plurality of data elements is stored.*

*20. A method, comprising:*

*a network device receiving a data stream via a network, wherein the data stream comprises a plurality of data elements that were transmitted in an original sequence;*

*the network device selectively storing at least first and second ones of the plurality of data elements, respectively, in at least first and second ones of a plurality of storage elements according to a first order that is based at least in part on respective portions of a recurring time interval in which the first and second data elements were received;*

*the network device generating information associated with the data stream, wherein the generated information includes information corresponding to at least the first and second ones of the plurality of the data elements;*

*the network device transmitting the plurality of data elements from the plurality of storage elements to a reordering element according to a second order; and*

*the reordering element outputting the plurality of data elements in the original sequence, wherein said outputting is based, at least in part, upon the generated information associated with the data stream.*

*21. The method of claim 20, wherein the generated information includes control information and status information.*

*22. The method of claim 21, wherein the control information includes a starting address of the data stream within the plurality of storage elements.*

*23. The method of claim 20, further comprising outputting at least one of the plurality of data elements in the original sequence while receiving one or more data elements from an additional data stream.*

*24. The method of claim 20, further comprising:*

*prior to said outputting, the reordering element causing the plurality of data elements to be stored according to the second order.*

*25. The method of claim 20, wherein said selectively storing includes receiving and discarding data marked as invalid prior to storing at least a third one of the plurality of data elements in a third one of the plurality of storage elements according to the first order.*

* * * * *